(12) United States Patent
Stephens et al.

(10) Patent No.: US 8,980,734 B2
(45) Date of Patent: Mar. 17, 2015

(54) GATE SECURITY FEATURE

(71) Applicant: Freescale Semiconductor, Inc., Austin, TX (US)

(72) Inventors: Tab A. Stephens, Austin, TX (US); Perry H. Pelley, Austin, TX (US); Michael B. McShane, Austin, TX (US); Paul A. Grudowski, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/790,627

(22) Filed: Mar. 8, 2013

(65) Prior Publication Data

US 2014/0252487 A1    Sep. 11, 2014

(51) Int. Cl.
*H01L 27/088*    (2006.01)
*H01L 21/28*    (2006.01)

(52) U.S. Cl.
CPC ........ *H01L 27/088* (2013.01); *H01L 21/28026* (2013.01)
USPC ...................................................... 438/591

(58) Field of Classification Search
CPC ........ H01I 23/57; H01L 23/57; H01L 23/573; H01L 23/576; G06F 21/79; G06F 21/14; G06F 21/75
USPC .............................................. 326/8; 438/598
See application file for complete search history.

(56) References Cited

U.S. PATENT DOCUMENTS

| | | | |
|---|---|---|---|
| 4,583,011 A * | 4/1986 | Pechar | 326/8 |
| 6,894,353 B2 | 5/2005 | Samavedam et al. | |
| 7,724,022 B1 | 5/2010 | Deskin et al. | |
| 2008/0169833 A1 | 7/2008 | Anderson | |
| 2010/0124818 A1 * | 5/2010 | Lee et al. | 438/589 |
| 2012/0273901 A1 * | 11/2012 | Yin et al. | 257/410 |

OTHER PUBLICATIONS

IBM Bulletin NN80045152, Fabrication Procedure for MOSFET Logic Integrated Circuit with very Thin Gate Oxide. Apr. 1980.*
S. Hung, Applied Materials, HiK/MG Gate Stack Issues and Landscape, 2009.
Pelly, Perry H. et al., U.S. Appl. No. 13/350,090, filed Jan. 13, 2012, entitled Semiconductor Devices with Nonconductive Vias.
(Continued)

*Primary Examiner* — Tom Thomas
*Assistant Examiner* — John Bodnar
(74) *Attorney, Agent, or Firm* — Terrile, Cannatti, Chambers & Holland, LLP; Michael Rocco Cannatti

(57) ABSTRACT

An anti-counterfeiting security circuit is incorporated into an authentic integrated circuit device to induce failure in a counterfeited integrated circuit device by forming the security circuit (e.g., 21, 31, 41, 51) with one or more operatively inert high-k metal gate transistors (e.g., HKMG PMOS 112) having switched or altered work function metal layers (82) where the security circuit defines a first electrical function with the one or more operatively inert high-k metal gate transistors and defines a second different electrical function if the one or more operatively inert high-k metal gate transistors were instead fabricated as operatively functional high-k metal gate transistors of the first polarity type with a work function metal layer of the first polarity type, the security circuit would define a second different electrical function.

14 Claims, 7 Drawing Sheets

(56) References Cited

OTHER PUBLICATIONS

D.C. Gilmer et al., LASER Anneal to Enable Ultimate CMOS Scaling with PMOS Band Edge Metal Gate/High-K Stacks, Proceeding of the 36th European Solid-State Device Research Conference, 2006.

C. Rawlings, Kilopass, Raising the Bar for Hardware Security: Physical Layer Security in Standard CMOS, IEEE Conference onTechnologies for Homeland Security, Mar. 3, 2008.

* cited by examiner

GATE SECURITY FEATURE

BACKGROUND OF THE INVENTION

1. Field of the Invention

The present invention is directed in general to semiconductor devices and methods for manufacturing same. In one aspect, the present invention relates to the fabrication of semiconductor devices or integrated circuits with enhanced physical layer security.

2. Description of the Related Art

With the advent of advanced pattern recognition software that can extract circuit schematics from die layer photos of semiconductor devices as layers of semiconductor devices are removed during reverse engineering processes, unauthorized copying, production, and sale of even the most complicated electric circuit designs has become possible.

BRIEF DESCRIPTION OF THE DRAWINGS

The present invention may be understood, and its numerous objects, features and advantages obtained, when the following detailed description is considered in conjunction with the following drawings, in which.

Figure 1:
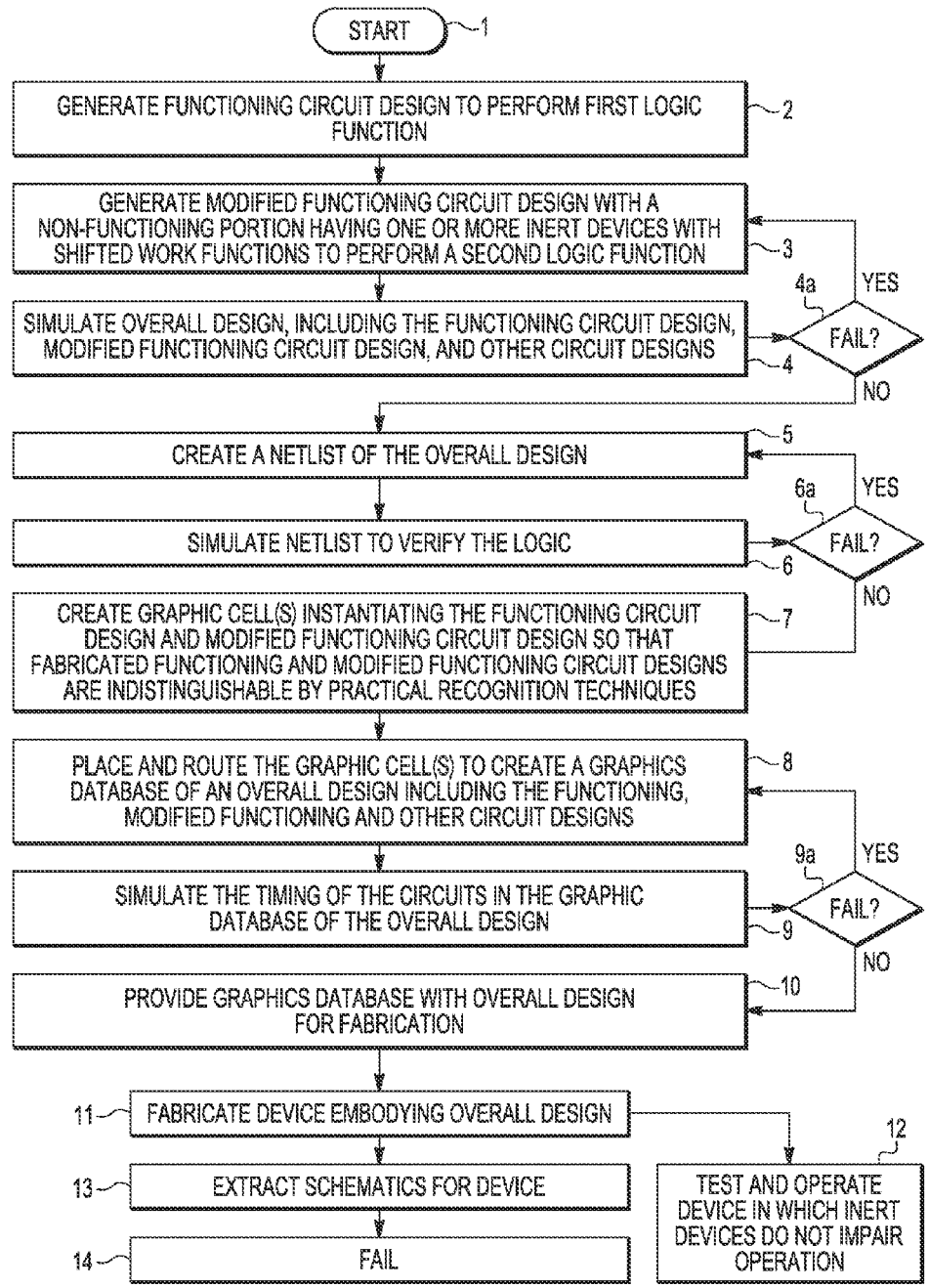
FIG. 1 illustrates a simplified flow chart for designing and fabricating semiconductor devices with one or more inert devices having shifted work functions in accordance with selected embodiments of the present invention.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A high-k metal gate CMOS transistor and associated fabrication process are described for fabricating gate security features wherein a work function metal layer for a transistor device of a first polarity type (e.g., PMOS transistor) is replaced or switched with the opposite work function metal layer for a transistor device of a second, opposite polarity type (e.g., NMOS transistor), thereby shifting the work function of the first polarity type transistor device so that it becomes inert or otherwise does not function. In addition to switching work function metal layers, the work function metal layer for a transistor device (e.g., PMOS transistor) may be implanted and/or doped to shift the threshold voltage (Vt) to make the transistor device work poorly or not at all. Once fabricated, the inert devices having switched work function layers are difficult if not impossible to detect through reverse engineering. By including in the overall design one or more functioning circuits having inert devices so that the functioning circuit may perform either of a pair of logic functions, depending on whether the inert device is functional or not, the inability to ascertain whether the inert device is functional can render program code for ROM memory and circuits inoperable if all inert devices are implemented as functional devices when copying a reversed engineered electric device. For complex die, a predetermined maximum percentage of inert devices are included to render reverse engineered devices inoperable when inert devices that are intended to be non-functioning are actually functioning in circuit designs that have been copied without permission or authorization. Since determining the desired work function of even a single inert device is difficult, extracting a properly working device design from the reverse-engineered product would be cost prohibitive, if not impossible.

In this disclosure, an improved system, apparatus, and fabrication method are described for fabricating CMOS metal-gate transistors to include gate security features using shifted work function layers that address various problems in the art where various limitations and disadvantages of conventional solutions and technologies will become apparent to one of skill in the art after reviewing the remainder of the present application with reference to the drawings and detailed description provided herein. Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the CMOS metal-gate transistors with gate security features. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention. In addition, while a "gate last" or replacement gate integration is detailed in selected figures, the same principles can be applied to "gate first" high-k metal gate (HKMG) integrations.

Turning now to FIG. 1, there is shown a simplified flow chart of a method for designing and fabricating semiconductor devices with one or more inert devices having shifted work functions in accordance with selected embodiments of the present invention. Once the method starts (step 1), a functioning circuit design for performing a specified logic function is generated (step 2). While any desired logic function may be designed, in an example implementation, the functioning circuit design may be an analog circuit (such as an amplifier), an analog to digital converter, a phase locked loop circuit, a digital circuit (such as an automotive controller) or other microprocessor having one or more processor cores and a large on-chip integrated second-level cache, or combinations of analog and digital circuits. As will be appreciated, the functioning circuit design flow step 2 may vary, depending on the type of integrated circuit being designed. For example, the functioning circuit design 2 for building an application specific integrated circuit (ASIC) may differ from a design 2 for designing a standard component or a very large scale integrated (VLSI) chip. In selected embodiments, the functioning circuit design may be provided as an input to a design process that is provided by an IP provider, a core developer, or other design company or may be generated by the operator of the design flow, or from other sources. The functioning circuit design may be provided in the form of a circuit schematic or other hardware-description language (HDL), such as Verilog, VHDL, C, or the like, and may be tangibly contained on one or more machine readable medium as a text file or a graphical representation of functioning circuit design.

At step 3, a modified functioning circuit design is generated based on the functioning circuit design. As generated, the modified functioning circuit design includes one or more non-functioning portions in which one or more transistor devices are designed to be non-functioning or inert by virtue of having shifted threshold voltages due to different gate work functions. In this way, the modified functioning circuit is provided with an apparent second logic function which is a defined logic function which would result if the inert transistor devices were functional, when in fact they are not due to the shifted threshold voltage. For example, the inert transistor devices may be designed as high-k metal gate CMOS transistors wherein a work function metal layer for a first type of transistor device (e.g., PMOS transistor) is replaced or switched with the opposite work function metal layer for a second type of transistor device (e.g., NMOS transistor), thereby shifting the threshold voltage of the first type of transistor device above Vdd so that it does not turn on and becomes inert or otherwise does not function. In addition to switching work function metal layers, the gate metal layer for a transistor device (e.g., PMOS transistor) may be implanted and/or doped to shift the threshold voltage (Vt) to make the transistor device work poorly or not at all.

At step 4, a circuit simulation step is performed to simulate the overall design, including the functioning circuit design, the modified functioning circuit design, and other circuit designs. While any desired circuit simulator may be used, in selected embodiments, a register-transfer level (RTL) function simulation unit conducts an RTL function simulation of the overall design to check whether or not the expected function can be obtained with the RTL description of the overall design. If the circuit simulation of the overall design determines that the description of the functioning circuit design, modified functioning circuit design and other circuit designs do not provide the expected function (affirmative outcome to fail test step 4*a*), then the method returns to the preceding step 3 to correct and revise the overall design. However, if the overall design passes the circuit simulation test (negative outcome to fail test step 4*a*), then the method performs a logic synthesis of the overall design.

At step 5, a netlist of the overall design is created. In selected example embodiments, a logic synthesizer may use an RTL description of the overall design to synthesize, or translate, the overall design into a netlist to define a list of wires, transistors, logic gates, control circuits, I/O, models, etc. that describe the connections to other elements and circuits in an integrated circuit design and recorded on at least one of machine readable medium. As will be appreciated, the netlist generation step 5 may be an iterative process in which the netlist is resynthesized one or more times depending on design specifications and parameters for the circuit.

At step 6, a logic simulation step is performed to verify the logic of the netlist description of the overall design, including the functioning circuit design, the modified functioning circuit design, and other circuit designs. While any desired logic simulator may be used, in selected embodiments, a verification technique (such as equivalence checking or model checking by evaluating the results form hand generated or random test patterns) can be used at step 6 to confirm and verify the logic of the netlist description. If the logic simulation of the overall design determines that the functioning circuit design, modified functioning circuit design and other circuit designs do not provide the expected logic function (affirmative outcome to fail test step 6*a*), then the method returns to the preceding step 5 to correct and revise the netlist description of overall design. However, if the overall design passes the logic simulation test (negative outcome to fail test step 6*a*), graphic cells are created for the overall design.

At step 7, graphic cells are created to instantiate the functioning circuit design and modified functioning circuit design so that, when fabricated, the functioning and the modified functioning circuit designs are indistinguishable by practical recognition techniques. At this stage, graphic cells may also be created to instantiate other circuit designs. In order to instantiate both functioning and modified functioning circuit designs, a graphic cell may be created which instantiates a first functioning circuit design (if predetermined transistor devices are rendered inoperative or inert by switching the work function metal layers) and which instantiates a first modified functioning circuit design (if predetermined transistor devices are rendered operative or functional by not switching the work function metal layers). To conform with the design flow, the graphic cells may be created as netlist descriptions.

At step 8, the graphic cell instantiations and other netlist descriptions of the overall design may be placed and routed to create a graphics database of an overall design including the functioning, modified functioning and other circuit designs. At this point, the graphics database may include one or more data set(s), known as the layout, describing geometric shapes to be applied to masks, though the data sets may also be modified later in the design flow. In order to control or limit potential increases in die size, the placement and routing of graphic cells of the modified functioning circuit may be automatically limited to a predetermined maximum percentage or limit on the number of gates. The desirability of limiting the graphic cells of the modified functioning circuit follows from the fact that the inert transistors in such cells consume die area that could be used for functioning transistors, so the limit may be defined as an upper limit using a maximum percentage of the die area given to the inert transistors. In addition, a lower limit may be set as the minimum number or percentage of inert transistors needed to ensure that reverse-engineering derived schematics are not cost-effective or are nearly impossible to extract properly. As disclosed herein, the maximum percentage may be set based the expected lost revenue if a part was copied versus the cost of die area to implement the security solution. In selected example embodiments in which there are massive numbers of circuits and transistors on modern electronics, the maximum percentage or limit may be in the range of 1 to 10% of the transistors, and more specifically less than 5%.

At step 9, a timing simulation and layout verification step is performed to confirm that logic and timing requirements for the overall design are properly represented by the geometric shapes graphics data set(s) of the layout, including the functioning circuit design, the modified functioning circuit design, and other circuit designs. While any desired layout verification or timing simulator may be used, in selected embodiments, simulation and verification tools, such as those provided by commercial vendors or in house tools, can be used to confirm and verify that all of the design requirements are met by the circuits in the graphics data set(s) of the layout. If the timing simulation and layout verification of the overall design determines that the overall design does not provide the required timing signals (affirmative outcome to fail test step 9a), then the method returns to the preceding step 8 to correct and revise the placement and routing of the overall design. However, if the overall design passes the timing simulation test (negative outcome to fail test step 9a), the graphics database with the overall design is provided for fabrication (step 10).

At step 10, the graphics database may include one or more data set(s) describing geometric shapes to be applied to photomasks for use in the manufacturing process. At this point, mask generation software is used manipulate the data set(s) and add test structures and other features to form the final data base which then written onto the photomasks using an electron beam.

As will be appreciated, the design process described heretofore may use a variety of inputs, such as library element inputs for commonly used elements, circuits, and devices, including models, layouts, and symbolic representations, for a given manufacturing technology nodes. The design process may also use design specification inputs, characterization data inputs, verification data inputs, design rule inputs, and/or test data file inputs which may include test patterns and other testing information. The design process may also include standard circuit design processes such as timing analysis, verification, design rule checking, place and route operations, and the like. One of ordinary skill in the art will also be familiar with other electronic design automation tools and applications used in design process.

At step 11, the photomasks may then be used in various semiconductor fabrication steps to produce a semiconductor circuit or circuits embodying the overall design. By designing and fabricating the device to include graphic cells instantiating the functioning and modified functioning circuit designs which are differentiated on the basis of whether a work function metal layer is switched or not, the overall design is provided with gate security features which do not readily appear under physical or electrical observation due to the difficulty of distinguishing the work function metal and high-k gate dielectric layers.

When implementing an advanced CMOS replacement gate technology (e.g., 32 nm and smaller) to form NMOS and PMOS transistors with gate security features, the design, simulation, and fabrication steps 1-11 produce integrated circuit devices which are functional in terms of testing and/or operation (step 12) because the inert transistor devices are designed and connected in the designed graphic cell instantiations so that they do not impair the circuit operation. For example, a graphics cell may be created as a dual logic function circuit element, where a first logic function is instantiated if a predetermined NMOS transistor device has its work function metal layer switched to use a PMOS work function metal layer, and where a second logic function is instantiated if the predetermined NMOS transistor device instead uses an (unswitched) NMOS work function metal layer. Similarly, a dual logic function circuit element graphic cell may implement a first logic function if a predetermined PMOS transistor device has its work function metal layer switched to use a NMOS work function metal layer, or alternatively may implement a second logic function if the predetermined PMOS transistor device instead uses an (unswitched) PMOS work function metal layer. As will be appreciated, the present disclosure applies to other fabrication processes, such as gate-first processes and/or FINFET gate processes, wherein it is difficult to detect thin gate device layers that are switched or altered to impair device function.

While the fabricated devices produced at step 11 are functionally operative, the use of inert transistor devices to implement dual logic function or multi-function circuit elements in the graphics cell effectively prevents the circuit schematics from being correctly extracted from the fabricated devices. For example, if a reverse engineering process (such as device de-processing, microscopy, or other invasive attack) is applied at step 13 in an attempt to extract circuit schematics for the fabricated device, the presence of inert transistor devices (having switched or altered work function metal layers) is difficult to detect, particular in random logic areas (sea of gates). In selected embodiments where a first type of work function metal layer for one or more selected transistors (e.g., selected NMOS transistors) is replaced with its opposite work function metal layer (e.g., the work function metal layer typically used for PMOS transistors), the extraction process 13 is likely to (incorrectly) interpret the selected transistor(s) as functional or operative transistors in the extracted circuit schematic. If properly designed as inert transistor(s) in the dual logic function or multi-function circuit elements, the incorrectly interpreted transistor(s) result in a failed circuit schematic extraction (step 14).

Figure 2:
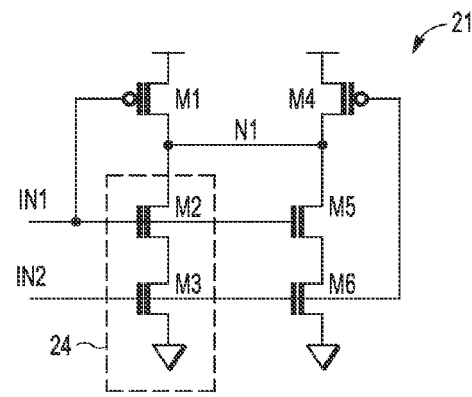
FIGS. 2-5 show example circuit schematic diagrams for or multi-function circuits/cells that may include inert gates with shifted work functions.

To illustrated selected examples of graphics cells for instantiating multi-function circuit elements, reference is now made to FIG. 2 which shows a first example circuit schematic diagram of a multi-function circuit or cell 21 that may include inert transistor gates 24 with shifted work functions. The depicted circuit 21 is a pull down circuit for a node N1 in response to first and second input signals IN1, IN2. Under control of the first and second input signals IN1, IN2, the node N1 is connected to a pull up reference voltage (e.g., Vdd) by a pair of PMOS transistors M1, M4, and may be connected to a pull down reference voltage (e.g., Vss) by series-connected NMOS pull down transistors M2, M3, and M5, M6. To this end, the gates of PMOS transistors M1, M4 and NMOS transistors M2, M5 are connected to a first input signal IN1, while the gates of NMOS transistors M3, M6 are connected to the second input signal IN2. As illustrated, the node N1 may be connected to the pull down reference voltage by two pairs of series-connected NMOS pull down transistors M2/M3 and M5/M6 when designed as functional or operative NMOS transistors. However, when the pair of series-connected NMOS pull down transistors M2, M3 are implemented as non-functional or inoperative NMOS transistors by switching or altering the work function metal layers, the resulting inert transistor pair M2, M3 pulls the voltage down at node N1 half as fast as compared to a pull down operation with functional transistors M2, M3. As a result, the inert transistors M2, M3 change the device size and timing performance of the pull down circuit 21, resulting in a failed hold operation in any extracted schematic which fails to detect that transistors M2, M3 are inert.

Figure 3:
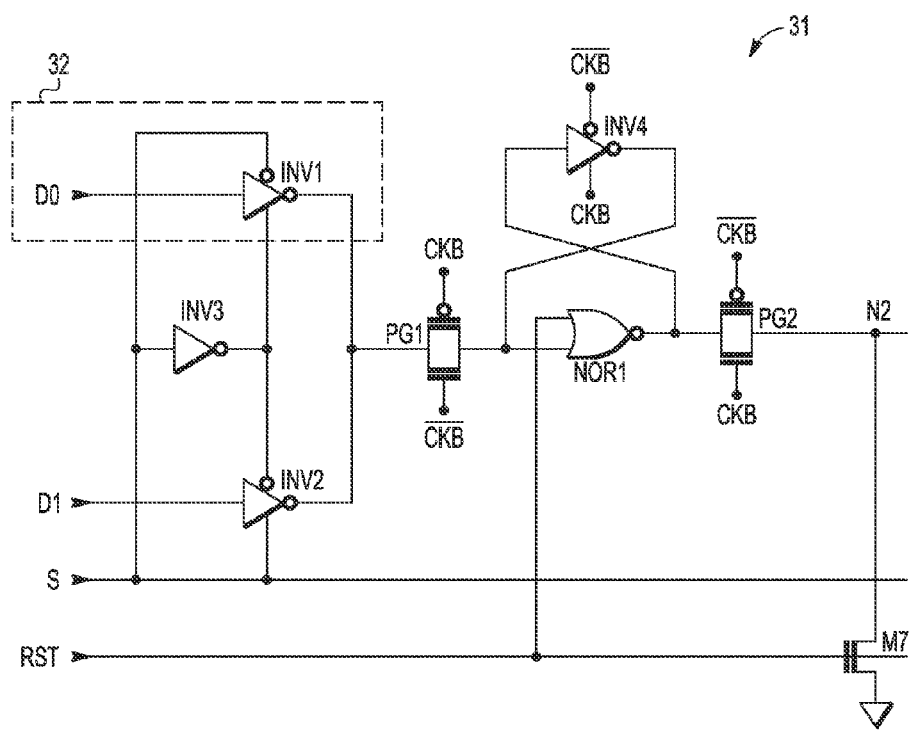

To illustrated another example graphics cell for instantiating multi-function circuit elements, reference is now made to FIG. 3 which shows an example circuit schematic diagram of a multi-function circuit or cell 31 that may include an input port 32 with inert transistor gates having shifted work functions. The depicted circuit 31 is a multi-input latch circuit which may receive first or second data input signals D0, D1 under control of an input set signal S and reset signal RST. As illustrated, the first or second data input signals D0, D1 is applied to first and second inverter circuits INV1, INV2 which are both controlled by a signal S and a third inverter circuit INV3 which inverts the input set signal S to provide control input signals to the first and second inverter circuits INV1, INV2 which function as tri-state inverters. Outputs from the first and second inverter circuits INV1, INV2 are applied through a first pass gate PG1 controlled by pass gate control signals (e.g., CKB, CKB-BAR) to a first input of a NOR gate NOR1. The first input of the NOR gate NOR1 is also connected across fourth inverter INV4 to the inverted output from the NOR gate NOR1 under control of the pass gate control signals (CKB, CKB-BAR), while the second input of the NOR gate NOR1 is connected to receive the input reset signal RST. With the output of the NOR gate NOR1 connected across second pass gate PG2 controlled by pass gate control signals (CKB, CKB-BAR) to an output N2 which may be connected to a pull down reference voltage (e.g., Vss) by NMOS pull down transistor M7 under control of the input reset signal RST, the depicted circuit 31 operates as a two input latch when the transistors used to form the first inverter circuit INV1 are designed as functional or operative transistors. However, when the transistors used to form the first inverter circuit INV1 are implemented as non-functional or inoperative transistors by switching or altering the work function metal layers, the input port 32 is not operative. As a result, the resulting dummy input port 32 changes the function of the circuit 31 from a two-input device to a one input latch device, resulting in a fake tri-state inverter in any extracted schematic which fails to detect inert transistors in the first inverter circuit INV1 resulting an injection of error signals into the latch.

Figure 4:
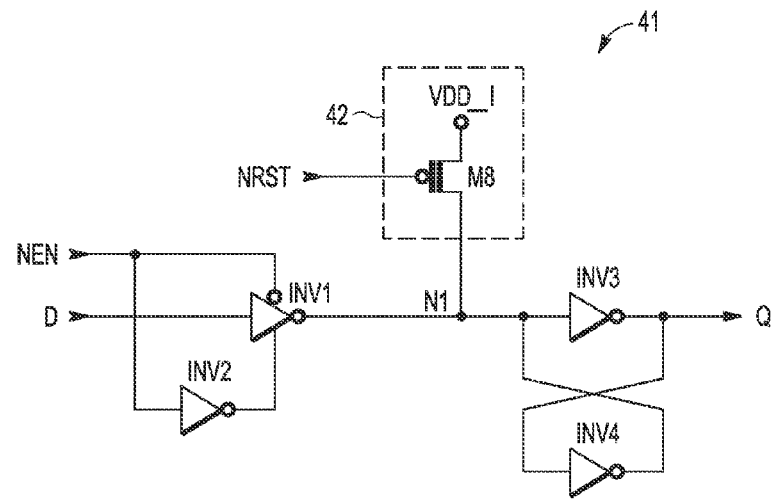

To illustrated another example graphics cell for instantiating multi-function circuit elements, reference is now made to FIG. 4 which shows an example circuit schematic diagram of a multi-function circuit or cell 41 that may include a pull up circuit 42 having an inert transistor gate with a shifted work function. The depicted circuit 41 is a reset circuit which may receive a data input signal D under control of an input enable signal NEN or reset signal NRST. As illustrated, the data input signal D is applied to a first inverter circuit INV1 which is controlled by the input enable signal NEN (and an inverted version thereof generated by a second inverter circuit INV2). The inverted data input signal D generated by the first inverter circuit INV1 is provided at internal node N1 which may be connected to a pull up reference voltage (e.g., Vdd) by a pull up PMOS transistor M8. The internal node N1 is also connected to a pair of cross-coupled inverters INV3, INV4 for generating an output signal Q. With this configuration, the depicted circuit 41 operates as a reset latch when the pull up PMOS transistor M8 is designed as functional or operative PMOS transistors. However, when the pull up PMOS transistor M8 is implemented as non-functional or inoperative transistor by using an NMOS work function metal layer, the pull up PMOS transistor M8 is not operative. As a result, the resulting inert pull up circuit 42 changes the function of the circuit 41 to a fake reset latch device, resulting in changed logic for any extracted schematic which fails to detect inert transistor M8 in the pull up circuit 42.

Figure 5:
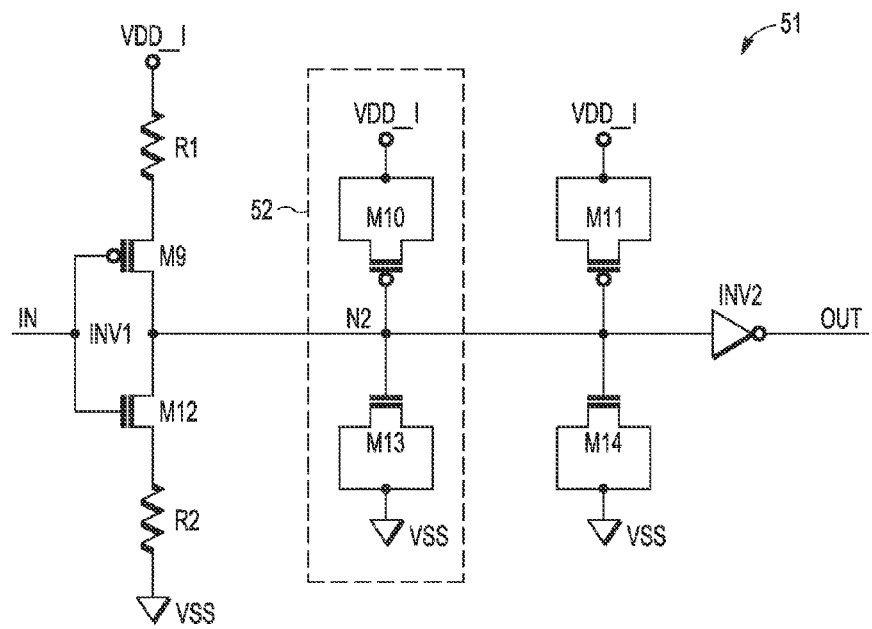

To illustrated another example graphics cell for instantiating an adjustable logic function, reference is now made to FIG. 5 which shows an example circuit schematic diagram of a dual inverter buffer logic function circuit or cell 51 that may include one or more timing adjustment capacitor circuits 52 having an inert transistor gate with a shifted work function. The depicted circuit 52 includes a first input inverter INV1 formed by series-connected PMOS transistor M9 and NMOS transistor M12 connected across resistors R1, R2 between first reference voltage (e.g., Vdd) and second reference voltage (e.g., Vss), thereby generating an inverted data input signal at internal node N2. In turn, the inverted data input signal at internal node N2 is applied across a second inverter INV2 to generate the buffered output OUT. As illustrated, the internal node N2 is also connected to a pair of timing adjustment capacitor circuits. The first timing adjustment capacitor circuit 52 includes PMOS and NMOS transistors M10, M13 connected as capacitors with their respective gates connected to the internal node N2, with the source and drain of the PMOS transistor M10 connected to the first reference voltage, and with the source and drain of the NMOS transistor M13 connected to the second reference voltage. In similar fashion, a second timing adjustment capacitor circuit includes PMOS and NMOS transistors M11, M14 connected as capacitors to the internal node N2. With this configuration, the depicted circuit 51 operates as a delay buffer having a first specified delay when the PMOS and NMOS transistors M10, M13 are designed as functional or operative transistors. However, when the PMOS and NMOS transistors M10, M13 are implemented as non-functional or inoperative transistors by switching or altering the work function metal layers, the first timing adjustment capacitor circuit 52 is not operative. As a result, the inert timing adjustment capacitor circuit 51 changes the delay of the delay buffer 51, resulting in changed timing performance for any extracted schematic which fails to detect inert transistors M10, M13 in the timing adjustment capacitor circuits 51.

As shown with reference to the example graphics cells illustrated in FIGS. 2-5, various types of circuits can be specified with standard cells through selective use of switched or altered work function metal layers to render one or more transistors in the standard cell functionally inoperative or inert. If the standard cells have a similar topology except for the use of the switched work function metal layer in the gate electrode, it would be difficult to ascertain a circuit's functional topology during reverse engineering since the material composition of each work function metal layer is very difficult to distinguish, especially in random logic areas. As a result, switching of work function metal layers can be used to thwart attempts to reverse engineer circuit designs by making it impossible to distinguish functional transistors from inert transistors. If an inert transistor in the manufactured device is identified during a reverse engineering schematic extraction process as a functional transistor, the resulting circuit schematic will not function as intended or desired. For example, the circuits in FIGS. 2-5 can be configured to provide a different level of performance or functionality, depending on which elements are implemented with inert transistors. In addition, inert transistors with switched/altered work function metal layers can be used in various types of circuits including read-only memory designs, analog circuits, as well as circuit design systems that use standard cells.

Figure 6:
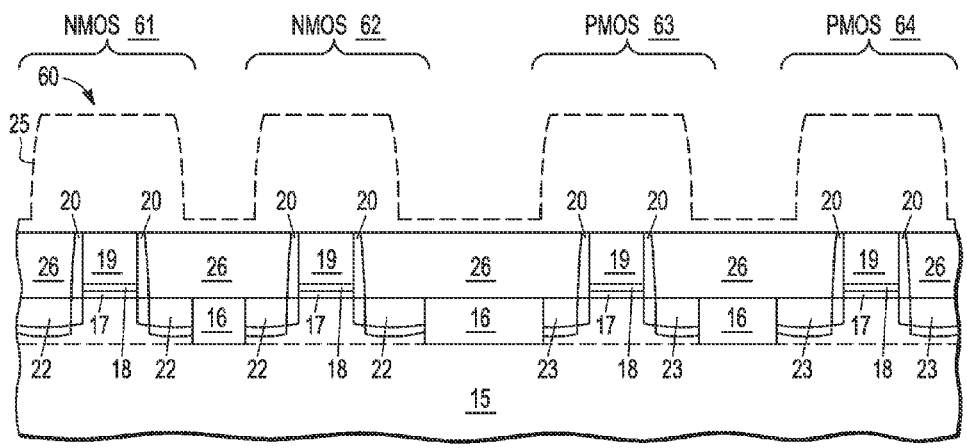
FIGS. 6-11 show an example semiconductor device during successive phases of a replacement gate fabrication sequence in which NMOS and PMOS work function gate layers are separately formed to include a PMOS device with an NMOS work function gate layer.

FIGS. 6-11 showing an example semiconductor device during successive phases of a replacement gate fabrication sequence in which NMOS and PMOS work function gate layers are separately formed to include a PMOS device with an NMOS work function gate layer. In FIG. 6, there is shown a partial cross-sectional view of a semiconductor structure 60 in which NMOS transistors 61, 62 and PMOS transistors 63, 64 are formed with sacrificial gate electrodes 17-19 which include one or more poly gate layers in accordance with selected embodiments of the present disclosure. Though the various structures, well, and layer regions are illustrated in simplified form with straight lines and curved or corner regions, it will be appreciated that the actual profile(s) for the different structures, well, and layer regions will not necessarily conform to simplified depictions, but will instead depend on the specific fabrication process(es) used. For example, the various well regions may have a curved junction profile reflecting the implantation and heating steps used in the formation of same. In addition, the depicted transistor structures may be formed with different semiconductor materials having P-type conductivity and N-type conductivity. With the P-type materials, the dopant concentrations vary from lowest dopant concentrations (P−), higher dopant concentration (P), even higher dopant concentration (P+), and the highest dopant concentration (P++). Similarly, the dopant concentrations for the N-type materials vary from lowest dopant concentrations (N), higher dopant concentration (N+), and the highest dopant concentration for (N++).

In the semiconductor structure 60, the depicted transistor device structures 61-64 are shown as being formed on or as part of a substrate 15 which may be formed as a bulk semiconductor substrate or other substrate in which one or more additional semiconductor layers and/or well regions are formed using epitaxial semiconductor growth and/or selective doping techniques as described more fully hereinbelow. For example, the substrate 15 may be a semiconductor-on-insulator (SOI) type substrate which includes a semiconductor substrate, buried insulator layer formed over the substrate, and p-type semiconductor substrate layer formed over the buried insulator or oxide layer (not shown). Alternatively and depending on the type of transistor being fabricated, the semiconductor substrate 15 may be implemented as a bulk silicon substrate, single crystalline silicon (doped or undoped), SOI substrate, or any semiconductor material including, for example, Si, SiC, SiGe, SiGeC, Ge, GaAs, InAs, InP, as well as other II/V or II/VI compound semiconductors or any combination thereof. As indicated by the dashed line, an upper portion of the substrate 15 defines the active substrate layer which may be separately doped in different device regions.

In an upper region of the semiconductor substrate 15, a plurality of shallow trench isolation (STI) structures 16 are formed that divide the substrate 15 into separate regions, such as NMOS device regions 61, 62 and PMOS device regions 63, 64. As will be appreciated, the STI structures 16 may be formed using any desired technique, such as selectively etching an opening in the substrate 15 using a patterned mask or photoresist layer (not shown), depositing a dielectric layer (e.g., oxide) to fill the opening, and then polishing the deposited dielectric layer until planarized with the remaining substrate 15. Any remaining unetched portions of the patterned mask or photoresist layer(s) are stripped. As will be appreciated, the STI structures 16 may be formed in other ways in other embodiments. Although not shown, the active substrate layers between the STI regions 16 may be doped differently, depending on whether the transistors formed in each area are n-type or p-type devices. For example, the active substrate layers in the PMOS regions 63, 64 may be implanted with arsenic or phosphorus to form N-well regions (not shown), while the active substrate layers in the NMOS regions 61, 62 may be implanted with boron or indium to form P-well regions (not shown).

In the semiconductor substrate 15, different transistor device structures 61-64 may be formed using one or more shared processing steps to form sacrificial gate electrodes 17-19 with one or more poly gate layers. By way of providing a non-limiting example of processing steps that may be used, one or more gate dielectric layers 17, 18 may be formed over the substrate 15 and STI structures 16, such as by growing or deposition a buffer interface layer 17 and then depositing one or more high-k gate dielectric layers 18 to a predetermined gate dielectric thickness. While the buffer interface layer(s) 17 may be formed with any desired technique, in selected embodiments, a buffer interface layer 17 is formed by thermally growing a layer of silicon dioxide to a predetermined thickness of approximately 8-9 Angstroms, though a thinner or thicker layer may also be used. In selected embodiments, a first high-k gate dielectric layer 18 is formed by depositing a high-k gate dielectric material with a relatively high dielectric constant value on top of the semiconductor structure 60 over buffer interface layer 17 using chemical vapor deposition (CVD), plasma-enhanced chemical vapor deposition (PECVD), physical vapor deposition (PVD), atomic layer deposition (ALD), or any combination(s) of the above. In selected embodiments, the first high-k gate dielectric layer 18 may be formed by a low temperature CVD or ALD process to a predetermined final thickness in the range of 1-100 Angstroms (e.g., 10-50 Angstroms, or more particularly, 20-30 Angstroms), though other thicknesses may be used. A suitable high-k gate dielectric material for the gate dielectric layer 18 is an insulator material having a dielectric constant value k of 7.0 or greater, including a hafnium-based dielectric such hafnium silicate (e.g., $Hf_xSi_{1-x}O_y$) or hafnium oxy-nitride (e.g., $Hf_xSi_{1-x}O_yN_z$), though other silicates of zirconium, aluminum, lanthanum, strontium, tantalum, titanium and combinations thereof may also be used, including but not limited to $HfSiO_x$, $ZrSiO_x$, $LaSiO_x$, $YSiO_x$, $ScSiO_x$, $CeSiO_x$, and $HfLaSiO_x$. In addition, multi-metallic oxides (for example barium strontium titanate, BST) may also provide high-k dielectric properties. A suitable temperature for the deposition process is in the range of approximately 200 degrees Celsius to approximately 400 degrees Celsius. As will be appreciated, the first high-k gate dielectric layer 18 may be formed in other ways in other embodiments. And though not shown, the high-k dielectric layer 18 formed in the NMOS device regions 61, 62 may be formed with different materials or layers than used to form the high-k dielectric layer 18 in the PMOS device regions 63, 64. In other embodiments, the high-k dielectric layer 18 can be formed later in the process flow, just prior to metal gate deposition.

On the gate dielectric layer(s) 17, 18, one or more patterned conductor layers 19 may be formed. In an example embodiment, the patterned conductor layers 19 are formed by blanket-depositing a layer of polysilicon or SiGe over the gate dielectric layer(s) 17, 18 by chemical vapor deposition (CVD), plasma-enhanced chemical vapor deposition (PECVD), physical vapor deposition (PVD), atomic layer deposition (ALD), or any combination(s) of the thereof to a thickness of approximately 500-2000 Angstroms, though a thinner or thicker layer may also be used. The conductive gate stack layer(s) and underlying gate dielectric layers may be anisotropically etched to form the sacrificial gate electrode stacks 17-19 for the CMOS transistor devices 61-64. As will be appreciated, any desired gate patterning and etch sequence may be used to form the patterned gate electrode stacks, including but not limited to photoresist or a hard mask formation, dielectric hardmask etch (using the photoresist as a mask), anti-reflection coating etch (using the remnant dielectric hardmask as a mask), pre-etch cleaning, oxide break through, main poly plasma etch, soft landing etch, poly clean overetch, and post-etch cleaning.

Once the patterned sacrificial gate electrode stacks 17-19 are formed, one or more doped regions 22, 23 may be formed in the substrate 15 by implanting impurities around the gate electrode stacks 17-19 and any implant masks using conventional implanting processes to implant ions having a predetermined conductivity type. For example, lightly doped p-type regions may be formed in the PMOS transistors 63, 64 by implanting p-type dopants into the regions 23 using an implant mask to protect the NMOS transistor region, while lightly doped n-type regions may be formed in the NMOS transistors 61, 62 by implanting n-type dopants (e.g., arsenic, phosphorus or antimony) into the regions 22 using an implant mask to protect the PMOS transistor region. At this juncture, one or more sidewall spacers 20 may be formed on the patterned gate electrode stacks 17-19 as implant masks by forming and anisotropically etching a mask layer (e.g., silicon dioxide or nitride) on the patterned gate electrode stacks 17-19. Using the etched gate electrode stacks 17-19 and sidewall spacers 20 in combination with one or more patterned implant masks (not shown), the NMOS transistors 61, 62 may be implanted with n-type dopants to form the N+ source/drain regions 22 and the PMOS transistors 63, 64 may be implanted with p-type dopants to form the P+ source/drain regions 23. In selected embodiments, the sidewall spacers 20 may be form of single or multiple layers, including liners under the sidewall spacers. In selected embodiments, first sidewall spacers may be formed after the patterned gate electrode stack and before the lightly doped implants to form doped regions prior to the formation of the sidewall spacers 20 and source and/or drain regions. The lightly doped implants may include halo and extension implants. To perform the implantation step, a mask is used to protect other parts of the semiconductor structure during implantation, and one or more sidewall spacers may also be used as implant masks by forming and anisotropically etching a mask layer (e.g., silicon dioxide or nitride) to form spacers on the sidewalls of the defined gates. Again, the selective implantation of source/drain regions may use existing CMOS processing technology processes, such as masking and implanting processes. In addition, the implanted regions 22, 23 are subsequently annealed or heated to drive or diffuse the implanted ions into the substrate 15 to a predetermined depth and lateral extent, though this can be done at a later stage in the fabrication process. It should be stated that all transistors, whether used as functional or inert transistors, will receive the appropriate doping type such that an NMOS still looks like an NMOS and a PMOS still looks like a PMOS upon reverse-engineering the implanted regions 22 and 23. In other words, only the metal gate layer 18 is switched to convert a transistor from functional to inert.

As shown in FIG. 6, one or more planarized dielectric layers 26 are formed over the CMOS transistor devices 61-64 and the STI structures 16. The planarized dielectric layer(s) 26 may form at least part of a first interlayer dielectric stack that electrically isolates the device components 61-64 formed on the substrate 15 from one another. Though not shown, an initial etch stop layer may be formed at the bottom of the planarized dielectric layer(s) 26, such as by depositing silicon nitride to serve as a first mobile ion barrier layer. In addition or in the alternative, the planarized dielectric layers 26 may be formed with one or more dielectric pre-metal inter-level dielectric layers, including a deposited dielectric layer formed over the etched gate electrode stacks 17-19 to a thickness of approximately 500-5000 Angstroms, though other thicknesses may also be used. Any desired dielectric material may be used to form the dielectric layer(s) 26, though in accordance with various embodiments, the dielectric layer is formed by depositing a conformal layer of silicon dioxide or other dielectric material using CVD, PECVD, PVD, ALD or any combination thereof. (In FIG. 6, the deposited conformal dielectric layer 25 is depicted with the dashed lines.) In addition, the deposited dielectric layer can be planarized to form the dielectric layer 26, alone or in combination with other dielectric layers, such as one or more gettering dielectric layers (e.g., a BPTEOS layer), sub-atmospheric tetra-ethyl ortho-silicate (SATEOS) layer(s), low-pressure TEOS (LP-TEOS) CVD layer(s), plasma-enhanced TEOS (PETEOS) layer(s), and/or $SiO_xN_y$, atmospheric pressure TEOS (AP-TEOS) layer(s), high density plasma (HDP) PSG (phosphosilicate glass) or HDP USG (undoped silicate glass) layer(s). At this point, the deposited dielectric layer is planarized using any desired planarization process, such as a planarization process that uses a chemical mechanical polish step to form a substantially planar surface on the planarized dielectric layer 26. By using a CMP process, the planarized dielectric layers 26 exposes the etched gate electrode stacks 17-19. In selected embodiments, the CMP process is timed. In selected embodiments, the CMP process is end-pointed using in-situ interferometry or other conventional endpoint techniques. The CMP process may partially remove a portion of etched gate electrode stacks 17-19, or it may remove a minimal amount and leave these structures with substantially their original thickness. As will be appreciated, the planarized dielectric layers 26 may be densified with one or more anneal process steps, though it will be appreciated that an anneal process may also be applied subsequently in the fabrication process.

Figure 7:
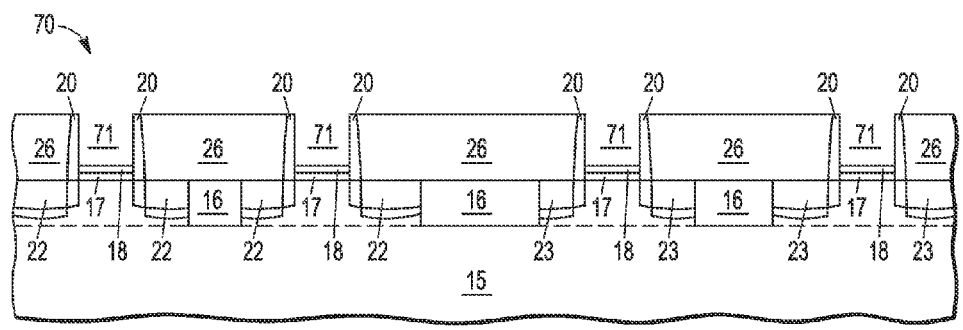

FIG. 7 illustrates processing of the semiconductor structure 70 subsequent to FIG. 6 after the sacrificial gate electrode layers 19 are removed to form CMOS gate electrode openings 71 in the planarized dielectric layer 26. In particular, one or more etch processes are applied to remove the constituent layers of the sacrificial gate electrode layers 19 in the CMOS transistors 61-64. For example, a first poly etch process is applied to remove the exposed portions of the patterned gate poly layers 19, where the poly etch process is selective to the material used to form the planarized dielectric layer 26 (e.g., oxide). The removal of the exposed portions of the patterned poly layers 19 may use any desired poly etch process, including a dry etching process such as reactive-ion etching, ion beam etching, plasma etching or laser etching, a wet etching process wherein a chemical etchant is employed or any combination thereof. After the patterned poly layers 19 are removed, the gate dielectric layers 17, 18 may be retained at this point. For example, if the gate dielectric layer 18 were previously formed as high-k gate dielectric layers, the selective removal of the patterned poly layers 19 leaves the high-k gate dielectric layer 18 exposed at the bottom of the electrode openings 71. However, in other embodiments, one or more dielectric etch processes are applied to remove the exposed portions of the patterned gate dielectric layers 17, 18 once the exposed portions of the patterned poly layers 19 are removed. As will be appreciated, any desired dielectric etch process may be used, including a dry etching process such as reactive-ion etching, ion beam etching, plasma etching or laser etching, a wet etching process wherein a chemical etchant is employed or any combination thereof. In this case, the gate dielectric layers are subsequently reformed. In yet other embodiments, the gate dielectric layers are not deposited for the first time until now, after the removal of the poly layers 19.

Figure 8:
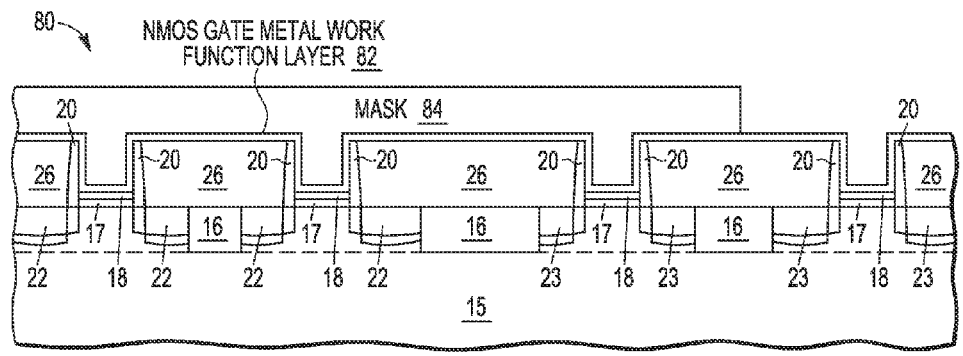

FIG. 8 illustrates processing of the semiconductor structure 80 subsequent to FIG. 7 after a first work function-setting metal or metal-based layer 82 is formed and then selectively masked with a patterned mask layer 84 to expose the PMOS transistor region 64. In selected embodiments, the first work function-setting metal or metal-based layer 82 is formed on the high-k gate dielectric layer 18 in at least the CMOS gate electrode opening 71 using any desired deposition or sputtering process, such as CVD, PECVD, PVD, ALD, molecular beam deposition (MBD) or any combination(s) thereof. The first metal-based layer 82 may include an element selected from the group consisting of Ti, Ta, Mo, W, Nb, and V. In selected embodiments, the first metal-based layer 82 is formed with a metal or metal-based layer that has a work function near the conduction band edge of the substrate material 15 that is suitable for an NMOS transistor. For example, the metal-based gate layer 82 may be formed over the semiconductor structure 80 and in the electrode openings 71 to cover the gate dielectric layer 18 using an atomic layer deposition (ALD) process that forms a TaC layer or TiAlN layer having a thickness of less than 20-250 Angstroms, though other metallic gate layer materials (such as HfC, TaSi, ZrC, Hf, etc.) or even a conductive metal oxide (such as $IrO_2$) with different thicknesses, may be used. An example process for depositing an NMOS gate metal work function layer 82 uses a physical vapor deposition (PVD) process to reactively sputter TaC from a Ta target in an Ar, CxHy ambient, though an ALD process could be used to selectively form a thin TaC layer 82 on the surface of the semiconductor structure 80 by applying a $TaF_5$ pulse (or some other tantalum-containing precursor, such as tantalum halide or tantalum metal organic), then purging with argon, then pulsing with plasma (e.g., $C_xH_y$) and then purging with argon again. This sequence of steps may be repeated until the desired thickness of TaC is obtained on the semiconductor structure 80. The foregoing sequence of steps may be used to form a single metal-based layer 82 over both the NMOS transistor device regions 61, 62 and the PMOS transistor device regions 63, 64. In addition, the first work function-setting metal or metal-based layer 82 may be formed from one or more layers. For example, the NMOS gate metal work function layer 82 may be formed over the first dielectric layer 18 by first forming a layer of TaMgC to a thickness of approximately 2.5 Angstroms, followed by the formation of a layer of TaC to a thickness of approximately 90 Angstroms. Since the thin TaMgC layer adjusts the work function of the TaC layer to match the ideal NMOS threshold voltage, the combined TaMgC/TaC layers may be used to form the NMOS gate metal work function layer 82. In selected embodiments, barrier metal layers, such as TaSiN, may be formed over the NMOS gate metal work function layer 82, such as TaC or TiAlN.

After forming the first work function-setting metal or metal-based layer 82 over the semiconductor structure 80, a patterned mask layer 84 is selectively formed over the NMOS transistors 61, 62 and PMOS transistor 63 to expose the PMOS transistor 64. The patterned mask layer 84 may be formed by applying and patterning a layer of photoresist or other masking layer(s), such as silicon nitride, to mask the gate electrode stacks 61-63, though a multi-layer masking technique may be used to form the patterned mask pattern 84. In any event, the material used to form the patterned mask layer 84 is selected so as to be selective to the resist the subsequent etch process(es) used to remove the exposed NMOS gate metal work function layer 82 from over the PMOS device region 64.

Figure 9:
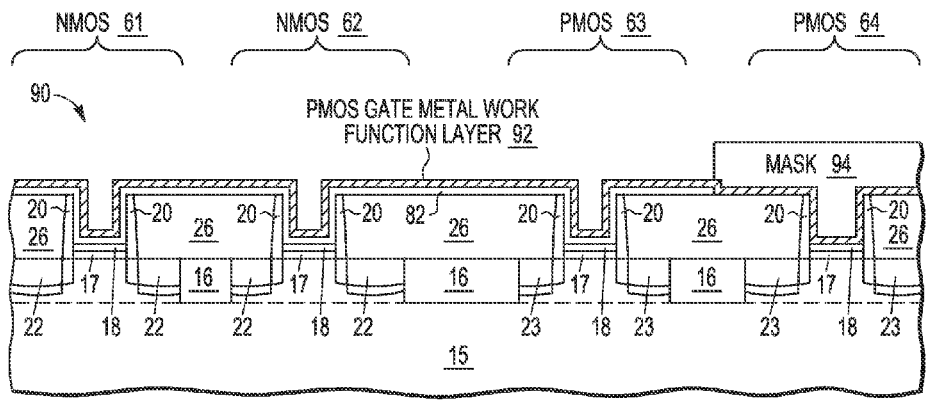

FIG. 9 illustrates processing of the semiconductor structure 90 subsequent to FIG. 8 after selectively etching or removing the exposed first work function-setting metal layer 82, removing the patterned mask layer 84, forming a second work function-setting metal or metal-based layer 92, and then forming a patterned mask layer 94 to cover the PMOS transistor region 64. In particular, one or more etch processes are applied with the patterned mask layer 84 in place to remove exposed portions of the NMOS gate metal work function layer 82 from the exposed PMOS region 64, thereby leaving portions of the NMOS gate metal work function layer 82 in the NMOS regions 61-62 and PMOS region 63. The pattern transfer and etching of the mask layer 84 may use one or more etching steps to selectively remove the unprotected portions of the NMOS gate metal work function layer 82, including a dry etching process such as reactive-ion etching, ion beam etching, plasma etching or laser etching, a wet etching process wherein a chemical etchant is employed or any combination thereof.

After selectively etching the exposed NMOS gate metal work function layer 82, the patterned mask layer 84 is stripped or otherwise removed using any desired etch and/or resist cleaning sequence. At this point, a second work function-setting metal or metal-based layer 92 is formed over the semiconductor structure 90 in at least the CMOS gate electrode opening 71 using any desired deposition or sputtering process, such as CVD, PECVD, PVD, ALD, molecular beam deposition (MBD) or any combination(s) thereof. Due to the preceding processing steps, the second work function-setting metal or metal-based layer 92 is formed on the high-k gate dielectric layer 18 in the PMOS device region 64, and is formed on the first metal-based layer 82 in the NMOS device regions 61, 62 and the PMOS device region 63. The second metal-based layer 92 is formed with a metal or metal-based layer that has a work function near the valence band edge of the substrate material 15 that is suitable for a PMOS transistor, and may include an element selected from the group consisting of TiN or $IrO_2$. For example, the metal-based gate layer 92 may be formed over the semiconductor structure 90 and in the electrode openings 71 using a chemical vapor deposition (CVD) process that forms a TiN layer having a thickness of less than 20-250 Angstroms, though other metallic gate layer materials (such as rhenium (Re), iridium (Ir), platinum (Pt), and ruthenium oxide ($RuO_2$), iridium oxide ($IrO_2$), molybdenum nitride (MoN), ruthenium (Rh), and indium oxide ($InO_2$), etc.) with different thicknesses, may be used. An example process for depositing a PMOS gate metal work function layer 92 uses a physical vapor deposition (PVD) process to reactively sputter Ti in the presence of a nitrogen atmosphere to form TiN. In selected embodiments, Ti may be sputtered onto the semiconductor substrate 90, then annealed in a nitrogen atmosphere to TiN. This sequence of steps may be repeated until the desired thickness of TiN is obtained on the semiconductor structure 90. The foregoing sequence of steps may be used to form a single metal-based layer 92 over both the NMOS transistor device regions 61, 62 and the PMOS transistor device regions 63, 64. In addition, the second work function-setting metal or metal-based layer 92 may be formed from one or more layers. In selected embodiments, barrier metal layers such as TaSiN may be formed over the PMOS gate metal work function layer 92 such as TiN.

After forming the second work function-setting metal or metal-based layer 92 over the semiconductor structure 90, a patterned mask layer 94 is selectively formed over the PMOS transistor region 64 to expose the NMOS transistors 61, 62 and PMOS transistor 63. The patterned mask layer 94 may be formed by applying and patterning a layer of photoresist or other masking layer(s), such as silicon nitride, to mask the PMOS gate electrode stack 64, though a multi-layer masking technique may be used to form the patterned mask pattern 94. In any event, the material used to form the patterned mask layer 94 is selected so as to be selective to the resist the subsequent etch process(es) used to remove the exposed PMOS gate metal work function layer 92 from over the NMOS transistors 61, 62 and PMOS transistor 63, while leaving the underlying NMOS gate metal work function layer 82.

As will be appreciated, the NMOS gate metal work function layer 82 and PMOS gate metal work function layer 92 may be formed in the CMOS gate electrode openings 61-64 using other processing steps. For example, the first metal interface layer may be deposited on the high-k dielectric layer(s) 18 in all exposed CMOS gate electrode openings 71 and over the planarized dielectric layer 26, followed by deposition of a second metal interface layer in the CMOS gate electrode openings of the NMOS transistors 61, 62 and PMOS transistor 63, and selective etching using a patterned mask (not shown) to expose and remove the second metal interface layer from the PMOS transistor 64 so that, when the patterned mask is removed, the first metal interface layer covers all CMOS transistors 61-64, while the second metal interface layer covers only the PMOS device 64. In forming one or more metal interface layers in the CMOS gate electrode openings, any desired deposition or sputtering process may be used (such as CVD, PECVD, PVD, ALD, molecular beam deposition (MBD) or any combination(s) thereof) in combination with suitable work function setting materials for forming functional NMOS and PMOS transistors, provided that at least one of the transistor devices is formed as an inert device by switching or altering the metal work function layer as described herein.

Figure 10:
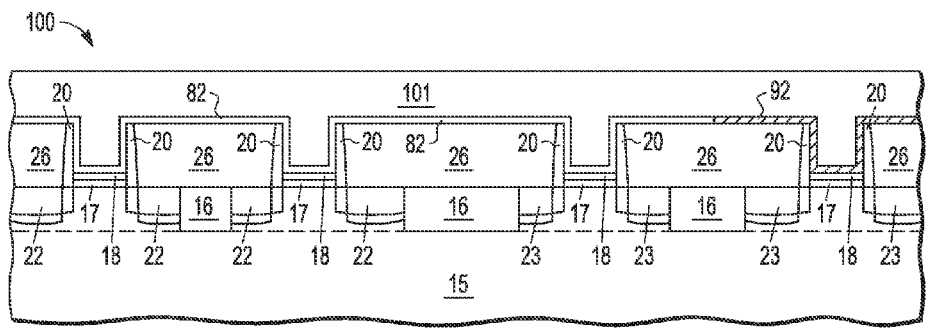

FIG. 10 illustrates processing of the semiconductor structure 100 subsequent to FIG. 9 after selectively etching or removing the exposed second work function-setting metal layer 92, removing the patterned mask layer 94, and then forming one or more metal gate layers 101. In particular, one or more etch processes are applied with the patterned mask layer 94 in place to remove exposed portions of the PMOS gate metal work function layer 92 from the exposed NMOS regions 61-62 and PMOS region 63, thereby leaving portions of the PMOS gate metal work function layer 92 in the PMOS region 64. The pattern transfer and etching of the mask layer 94 may use one or more etching steps to selectively remove the unprotected portions of the PMOS gate metal work function layer 92, including a dry etching process such as reactive-ion etching, ion beam etching, plasma etching or laser etching, a wet etching process wherein a chemical etchant is employed or any combination thereof.

After selectively etching the exposed PMOS gate metal work function layer 92, the patterned mask layer 94 is stripped or otherwise removed using any desired etch and/or resist cleaning sequence. At this point, one or more metal gate layers 101 are formed on the metal interface layer(s) 82, 92 in the CMOS gate electrode openings. In selected embodiments, the metal gate layer 101 is formed with one or more conductive layers, such as a first liner layer (e.g., Tantalum-based liner) and a second gate barrier layer formed with a metal or transition metal material including, as an example, titanium or TiN, that is formed using CVD, PECVD, PVD, ALD, MBD, or any combination(s) thereof to a predetermined thickness in the range of 200-1000 Angstroms (e.g., 500-600 Angstroms), though other materials and thicknesses may be used. In other embodiments, the metal gate layer 101 is a doped silicon-containing gate layer 101 disposed over the metal interface layer(s) 82, 92 to form a metal gate stack. In selected embodiments, the silicon-containing layer 101 is an amorphous or polysilicon cap layer or an amorphous/poly silicon germanium cap layer that is formed using CVD, PECVD, PVD, ALD, MBD, or any combination(s) thereof to a predetermined thickness in the range of 200-1000 Angstroms (e.g., 500-600 Angstroms), though other materials and thicknesses may be used. Silicon-containing gate layer 101 may also be a doped or undoped amorphous silicon or silicon germanium layer. As deposited, the amorphous silicon-containing gate layer 101 covers the NMOS and PMOS device areas 61-64. In addition, a silicide formation step is applied to the silicon-containing gate layer 101 to convert at least a portion of the silicon-containing gate layer 101 into a silicide for lower gate resistance. As will be appreciated, the formation of a metal-containing gate layer 101 would avoid any silicide-related processing complexity. Examples of the metal-containing gate layer 101 are aluminum-containing gate layers, followed by aluminum CMP to planarize the same.

Figure 11:
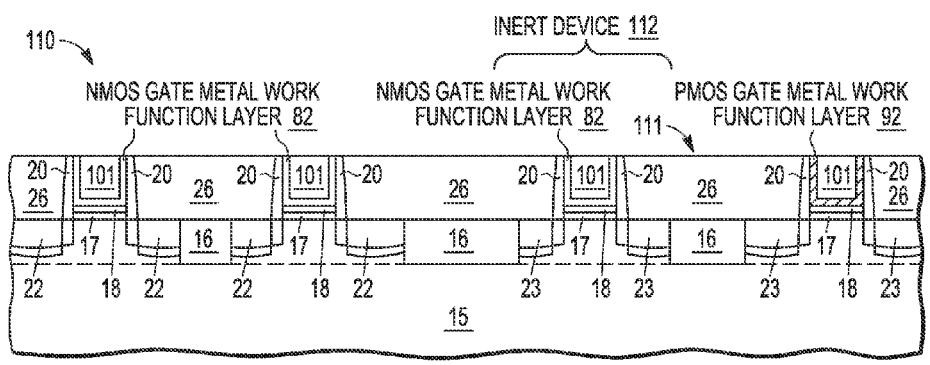

FIG. 11 illustrates processing of the semiconductor structure 110 subsequent to FIG. 10 after one or more planarization steps are applied to complete an inlaid or damascene fabrication sequence by removing excess portions of the one or more metal gate layers 101 formed above the planarized dielectric layer 26 to form planarized transistors 61-64. While any desired planarization process may be used, in accordance with various embodiments, the semiconductor structure 110 may be planarized with one or more polish and/or etch processes, such as using a chemical mechanical polish step to form a substantially planar surface 111 by planarizing the upper portions of the planarized dielectric layer 26 and CMOS gate electrode structures. Removal of extraneous portions of NMOS/PMOS gate metal work function layer 82/92, such as the portions shown on top of planarized dielectric layer 26 is desirable, as the removal prevents electrical shorting between transistors will also removing evidence of which transistors received each of the NMOS/PMOS gate metal work function layer 82/92.

As described hereinabove, the planarized CMOS transistors 61-64 are formed to include at least one inert transistor device by switching or altering the metal work function layer as described herein. In particular and as shown in FIG. 11, the PMOS transistor device 63 is fabricated as an inert device 112 by including an NMOS gate metal work function layer 82 over the high-k gate dielectric layer 18 instead of using a PMOS gate metal work function layer 92 that would normally be included in a PMOS transistor (such as PMOS transistor 64). Of course, the fabrication process can readily be modified to fabricate an inert NMOS transistor device by forming the NMOS transistor device to include a PMOS gate metal work function layer instead of using an NMOS gate metal work function layer, or to implant, dope, or otherwise modify the work function metal layer on the NMOS transistor device to shift the threshold voltage (Vt) to make the NMOS transistor work poorly or not at all.

By forming the PMOS transistor 63 with the switched work function metal layer 82 at the bottom of the gate electrode structure, it is difficult if not impossible to detect whether the resulting inert transistor 112 is functional or inert using reverse engineering techniques, such as sample preparation by lapping, scanning electron microscope (SEM) analysis, transmission electron microscope (TEM) analysis, or other circuit deconstruction techniques. This, in turn, creates difficulties in extracting correct circuit schematics from any standard graphics cells which use an inert transistor to instantiate multi-function circuit elements. While the work function metal layer switch may be detected on individual inert transistors through more exacting techniques, such as high-resolution TEM analysis, the use of such techniques to find more than individual inert transistors is cost-prohibitive, making proper circuit extraction through reverse engineering extremely difficult, if not impossible.

Figure 12:
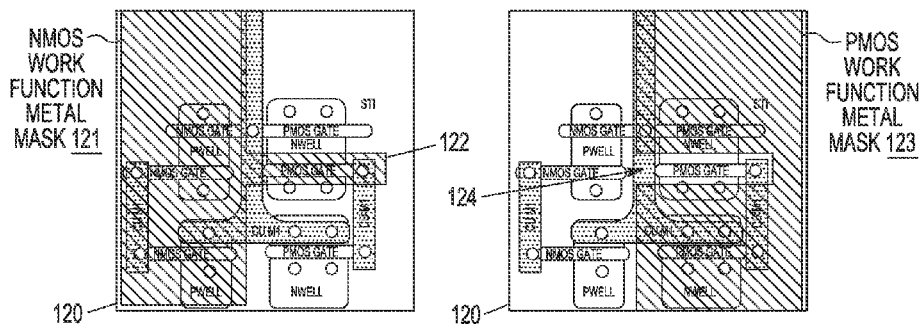
FIG. 12 illustrates example NMOS and PMOS work function metal masks for forming a PMOS device with an NMOS work function gate layer.

To illustrate an example of how selective work function masks may be used to selectively form inert transistor devices, reference is now made to FIG. 12 which illustrates example NMOS and PMOS work function metal masks 121, 123 for forming a PMOS device with an NMOS work function gate layer. To illustrate the relative placement of the masks 121, 123, two plan views of an integrated circuit region 120 are used to illustrate the NMOS and PMOS gate areas, as well as surrounding STI, N-well, P-well, contact, and first metal (M1) regions. The masks show their placement with respect to the NMOS and PMOS device areas during the formation of the NMOS and PMOS work function gate layers. As will be appreciated, other features (such as the contact and metal regions) are formed during subsequent processing. As shown on the left of FIG. 12, the placement of the NMOS work function metal mask 121 in relation to the plan view of the integrated circuit region 120 is defined to control the placement of the NMOS gate metal work function layer (e.g., layer 82) over the NMOS transistor gate electrode areas (e.g., 61, 62) and at least one PMOS transistor gate electrode (e.g., 63). As will be appreciated, the cross-hatched area shown in the mask 121 defines the area where the deposited NMOS work function metal layer 82 will be protected from subsequent removal, and includes one or more extension areas 122 over the PMOS transistor area where the NMOS work function metal layer is deposited and left in place of the PMOS gate metal work function layer (e.g., 92) that would normally be formed. As an alternative to the extension area(s) 122, the NMOS work function metal mask 121 may include a separate or discontinuous mask element over the PMOS gate area(s) where inert transistor devices are to be formed.

As a complement to the NMOS work function metal mask 121, 122, the placement of the PMOS work function metal mask 123 in relation to the integrated circuit region 120 (shown to the right of FIG. 12) is defined to control the placement of the PMOS gate metal work function layer (e.g., layer 92) over the functional PMOS transistor gate electrode areas (e.g., 64), but not the NMOS transistor gate electrode areas (e.g., 61-62) or the inert PMOS transistor gate electrode area (e.g., 63). In the cross-hatched area shown in the mask 123, the deposited PMOS work function metal layer 92 will be protected, and includes one or more openings 124 over the PMOS transistor area where the deposited PMOS work function metal layer will be removed. As an alternative to the extension area(s) 124, the PMOS work function metal mask 123 may include a separate or discontinuous mask element over the NMOS gate area(s) where inert transistor devices are to be formed.

As described herein, the gate security feature may be used with replacement gate processes, but may also be used with other transistor fabrication processes, such as gate first approaches or other technologies. For example, multi-gate MOSFET technologies, such as tri-gate or FinFET devices, have been developed to control leakage currents and overcome other limitations associated with transistor scaling into the nanoscale regime. To illustrate selected example embodiments for providing the gate security feature in a SOI FinFET device, reference is now made to FIG. 13 which shows a partial cross-sectional view of a semiconductor wafer structure 130 in which NMOS and PMOS FINFET transistor devices 161-164 are formed with selectively formed work function gate layers 136, 138 to fabricate an inert PMOS device 163 with an NMOS work function gate layer 136. Specifically, the structure 130 includes a first semiconductor layer 131 formed of a semiconductor material that has a first crystallographic orientation, such as a bulk silicon substrate, single crystalline silicon (doped or undoped), SOI substrate, or any semiconductor material including, for example, Si, SiC, SiGe, SiGeC, Ge, GaAs, InAs, InP as well as other Group VI and/or III-IV and/or II-VI compound semiconductors or any combination thereof. The structure 130 also includes a first insulator layer 132 formed on the first semiconductor layer 131 which provides a buried oxide (BOX) layer having a predetermined thickness (e.g., approximately between 100-1500 Angstroms thick) that is sufficiently thick to electrically isolate the first semiconductor layer 131 from the FinFET devices formed thereover. In particular, a plurality of FinFET channel structures 133 are defined on the first insulator by providing or forming, patterning, and etching a first SOI semiconductor layer (for example, Si, SiC, SiGe, SiGeC, Ge, GaAs, InAs, InP as well as other VI and/or III-IV and/or II-VI compound semiconductors or any combination thereof) having a predetermined thickness (e.g., approximately between 10-1000 Angstroms thick), doping type and/or level, and crystalline structure. The defined FinFET channel structures 133 will serve as the channel or body portions of FinFET transistor devices. In selected embodiments, the FinFET devices may be formed on bulk substrate without the buried oxide layer 131. Isolation between devices is provided by conventional methods, such as doping.

On the defined FinFET channel structures 133, a dielectric layer 134 is formed by depositing or growing one or more layers of insulator or high-k dielectric material (e.g., silicon dioxide, oxynitride, metal-oxide, nitride, hafnium oxide, hafnium silicate, zirconium oxide, zirconium silicate, etc.) using CVD, PECVD, PVD, ALD, thermal oxidation, or any combination(s) of the above, so that the top and sides of the fin structures 133 are covered with a dielectric layer. The resulting dielectric layer(s) 134 define the gate dielectric layer(s) for the FinFET transistor devices.

On the gate dielectric layer(s) 134, conductive gate layers are formed by depositing or forming work function metal layers 136, 138 as metal interface layers for one or more overlying conductive gate layers 139 to define functional and inert FinFET transistor devices. In particular, a first metal interface layer for the depicted FinFET NMOS transistors 161-162 and PMOS transistor 163 is formed with an NMOS gate metal work function layer 136, while the first metal interface layer for the depicted FinFET PMOS transistor 164 is formed with a PMOS gate metal work function layer 138. After forming the first metal interface layers 136, 138, a conductive gate layer 139 may be formed by depositing a first conductive layer (e.g., polysilicon, SiGe and/or a metallic layer) having a thickness in the range of 1-200 nanometers to cover the metal interface layers 136, 138. In selected embodiments, the conductive gate layer 139 may be formed from one or more layers. Though not shown in FIG. 13, the gate electrode layers 136, 138, 139 may also cover other regions of the structure 130 to form gate electrodes for the FinFET and planar MOSFET transistor devices. Subsequently, any desired gate pattern and etch processing steps may be used to form the desired etched gates over the FinFET body portions 133.

Figure 14:
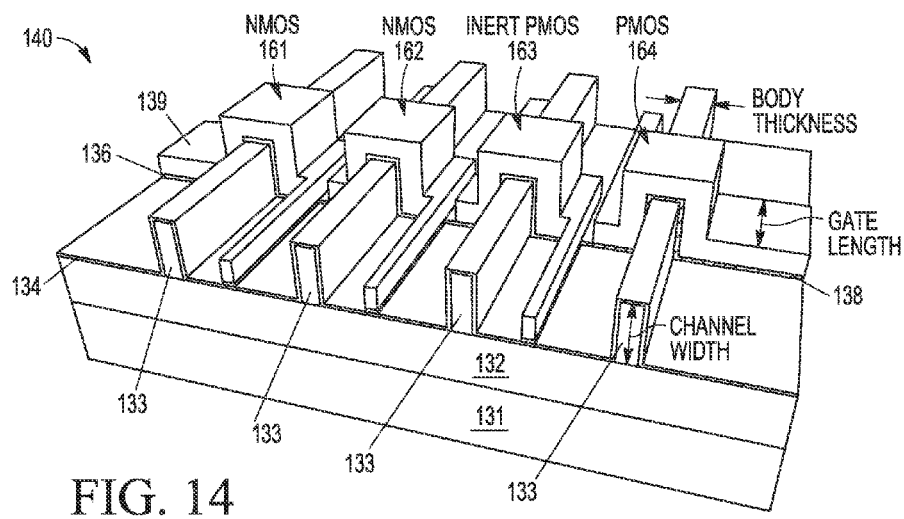

The result of the gate etch process is illustrated in FIG. 14, which depicts a perspective view of the SOI FinFET 140 formed after selective removal of the gate electrode layers 136, 138, 139. In particular, the SOI FinFET device 140 illustrates a plurality of NMOS and PMOS FINFET transistor devices 161-164 formed over and insulated from a substrate 131 (e.g., the first semiconductor layer) by one or more insulator layers 132. Each FinFET device includes a channel formed from a semiconductor fin structure 133 that connects source and drain regions and that is covered on the top and sides by one or more gate dielectric layers 134. In selected embodiments, the top of semiconductor fin structure 133 may not be used to form the channel. A body tie (not shown) to the fin structure can be provided when formed from a semiconductor layer that is epitaxially grown from the semiconductor substrate 131. Each semiconductor fin structure 133 is defined by body thickness and channel width dimensions, while each gate electrode formed with gate electrode layers 136, 138, 139 is defined by a gate length (L-gate) dimension. In a selected embodiment, these dimensions may be separately controlled for the FinFET devices in different device regions (e.g., NMOS and PMOS device regions).

Figure 13:
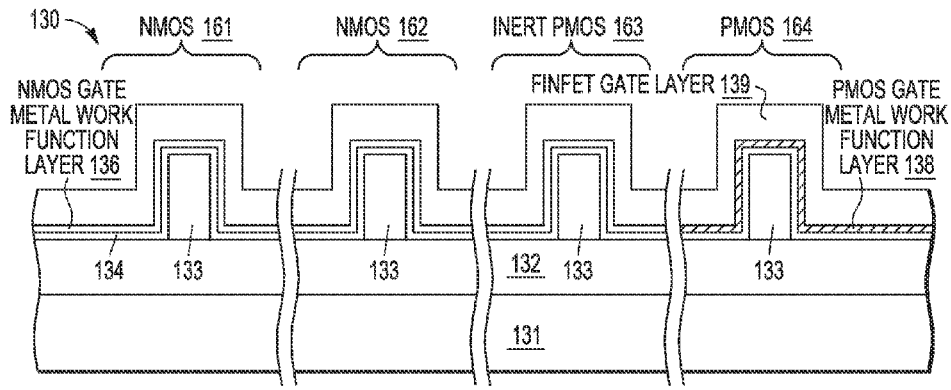
FIGS. 13-14 illustrate cross-sectional and perspective views of an example FINFET gate fabrication in which NMOS and PMOS work function gate layers are separately formed to fabricate a PMOS device with an NMOS work function gate layer.

In the example shown in FIGS. 13-14, the FinFET PMOS transistor device 163 is fabricated as an inert transistor by including an NMOS gate metal work function layer 136 over the gate dielectric layer(s) 134 instead of using a PMOS gate metal work function layer that would normally be included in a FinFET PMOS transistor (such as PMOS transistor 164). As a result, the depicted FinFET NMOS transistors 161-162 and FinFET PMOS transistor 164 are formed as functional devices, while the FinFET PMOS transistor 163 is formed as an inert transistor having a switched gate metal work function layer. Of course, the fabrication process can readily be modified to fabricate an inert FinFET NMOS transistor device by forming the NMOS transistor device to include a PMOS gate metal work function layer instead of using an NMOS gate metal work function layer, or to implant, dope, or otherwise modify the work function metal layer on the NMOS transistor device to shift the threshold voltage (Vt) to make the NMOS transistor work poorly or not at all.

As will be appreciated, additional processing steps may be used to complete the fabrication of the transistor devices described herein. In addition to various front end processing steps (such as sacrificial oxide formation, stripping, isolation region formation, gate electrode formation, extension implant, halo implant, spacer formation, source/drain implant, annealing, silicide formation, and polishing steps), additional backend processing steps may be performed, such as forming contact openings, contact plugs and multiple levels of interconnect(s) that are used to connect the device components in a desired manner to achieve the desired functionality. Thus, the specific sequence of steps used to complete the fabrication of the device components may vary, depending on the process and/or design requirements.

Figure 15:
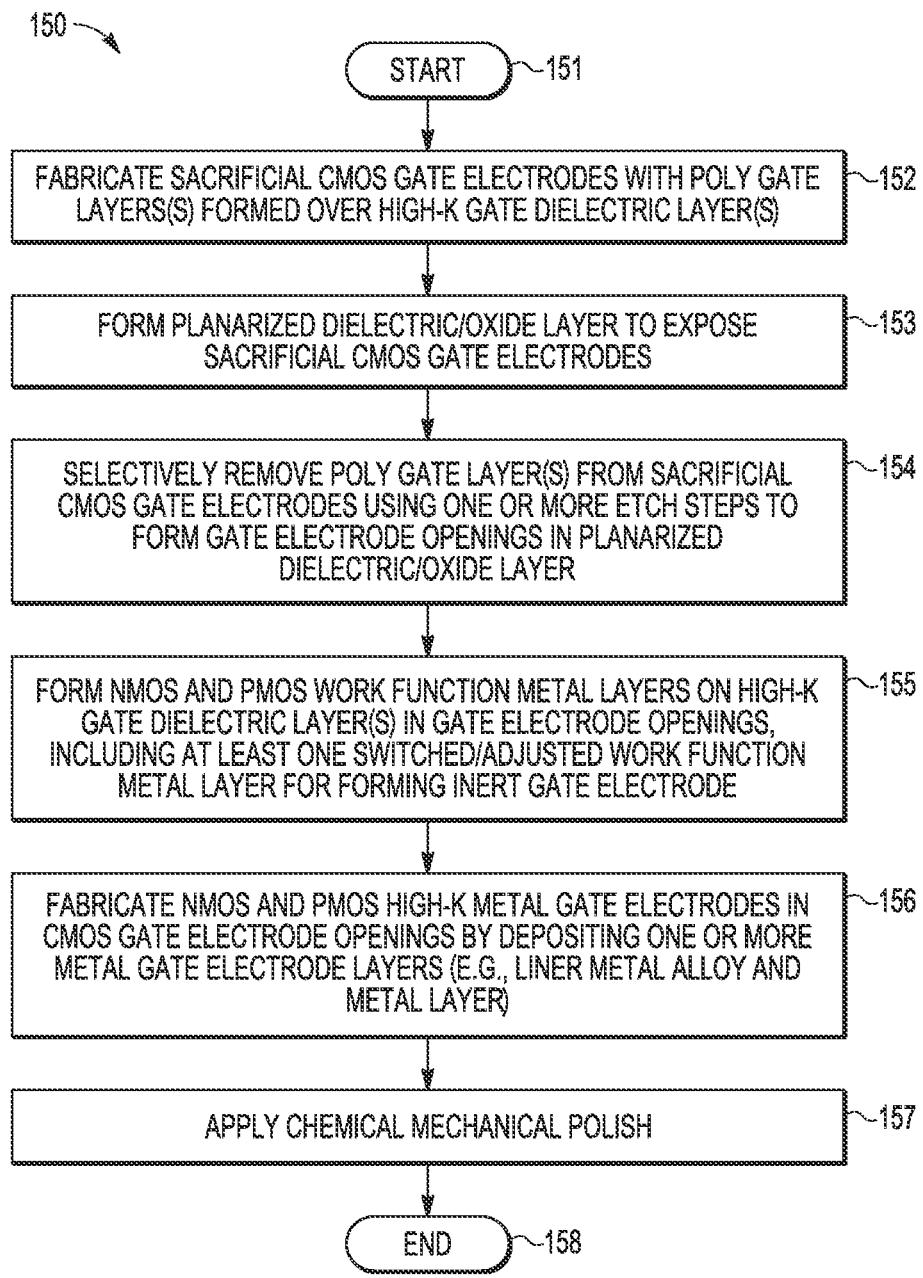
FIG. 15 illustrates an example process flow diagram of a replacement gate fabrication sequence in which NMOS and PMOS work function gate layers are separately formed to include a PMOS device with an NMOS work function gate layer.

FIG. 15 is an example process flow diagram illustrating an example replacement gate fabrication sequence 150 in which NMOS and PMOS work function gate layers are separately formed to include a PMOS device with an NMOS work function gate layer (and/or an NMOS device with an PMOS work function gate layer). Once the process begins at step 151 during the front end of line (FEOL) process, sacrificial CMOS gate electrode devices are formed at step 152 by forming and selectively etching one or more high-k gate dielectric layers (e.g., silicon dioxide and hafnium oxide layers) and gate electrode layers (e.g., polysilicon). At this stage or subsequently, the source and drain regions are formed in the underlying substrate in appropriate alignment with the sacrificial CMOS gate electrodes. Next, a planarized dielectric layer is formed over the sacrificial CMOS gate electrode devices at step 153. For example, the planarized dielectric layer may be formed by depositing a conformal layer or film of silicon oxide which is then polished to a flat or planarized surface which exposes at least the upper portions of the sacrificial CMOS gate electrode devices. At step 154, the sacrificial CMOS gate electrode devices are selectively removed using one or more etch steps to form CMOS gate electrode openings in the planarized dielectric layer. For example, one or more poly etch steps may be applied to remove the upper poly layer in the sacrificial CMOS gate electrode devices, such as by using an etch chemistry or process that will leave the underlying gate dielectric layers. If desired, the underlying gate dielectric layers may also be removed, followed by formation of one or more gate dielectric layers in the gate electrode openings. At step 155, NMOS and PMOS work function metal layers are selectively formed in the CMOS gate electrode openings in the planarized dielectric layer to cover the underlying high-k gate dielectric layer. The formation of the NMOS and PMOS work function metal layers is controlled to form functional transistor devices by including a metal interface layer that adjusts the work function of the functional gate to be close to the conduction band of the substrate material for the NMOS transistor or valence band of the substrate for the PMOS transistor, as the case may be. In addition, the formation of the NMOS and PMOS work function metal layers is controlled to form at least one selected transistor device by switching or altering the work function of the gate, thereby effectively increasing the absolute value of the threshold voltage (Vt) of the selected gate to above the Vdd power supply so that it is effectively shut off and rendered non-functional or inert. While different materials and processes may be used to form the constituent gate electrode layers for the NMOS and PMOS gate electrodes, respectively, the selected materials will include at least a first high-k gate dielectric layer and one or more metal-based gate electrode layers which may be individually chosen for the NMOS and PMOS transistor devices to form at least one non-functional or inert transistor device. After forming the NMOS and PMOS work function metal layers in the gate electrode openings, one or more metal gate electrode layers may be deposited in the gate electrode openings to cover the underlying work function metal layers at step 156. For example, the metal gate electrode layers may include a liner layer, metal alloy layer, and/or metal gate layer. At step 157, the wafer is planarized (e.g., with a CMP process), and the process ends at step 158.

By now it should be appreciated that there is provided herein method and apparatus for implementing hardware security in an integrated circuit device. In the disclosed methodology, an integrated circuit device is obtained which includes a security circuit formed with at least one or more operatively inert high-k metal gate transistors of a first polarity type having a work function metal layer of a second, opposite polarity type. As formed, the security circuit defines a first electrical function with the one or more operatively inert high-k metal gate transistors and defines a second different electrical function if the one or more operatively inert high-k metal gate transistors were instead fabricated as operatively functional high-k metal gate transistors of the first polarity type with a work function metal layer of the first polarity type. In selected embodiments, the security circuit is formed as a pull down circuit for a first node connected to a pull down reference voltage by a plurality of pull down transistors, including one or more first functionally operative high-k metal gate transistors connected between the first node and the pull down reference voltage, and one or more second operatively inert high-k metal gate transistors connecting the first node to the pull down reference voltage. In other embodiments, the security circuit is formed as a latch circuit for connecting one or more input ports to an internal node via a plurality of input or inverter circuits, where at least one of the plurality of input/inverter circuits includes one or more operatively inert high-k metal gate transistors to prevent an input port from connecting to the internal node. In other embodiments, the security circuit is formed as a pull up circuit connecting an internal node to a pull up reference voltage for resetting a latch with one or more pull up transistors including one or more operatively inert high-k metal gate transistors connecting the internal node to the pull up reference voltage. In other embodiments, the security circuit is formed as a timing delay circuit connecting an internal node to a reference voltage with one or more operatively inert high-k metal gate transistors connected as capacitors between the internal node and the reference voltage. The step of obtaining the integrated circuit device can include purchasing, receiving, acquiring, fabricating, forming, manufacturing, or otherwise coming into possession of the integrated circuit device. For example, the integrated circuit device may be obtained with a fabrication sequence which includes providing or receiving a wafer having a plurality of sacrificial transistor gate structures formed over the substrate. In the example fabrication sequence, a dielectric layer is formed having a substantially flat upper surface which exposes an upper surface of the plurality of sacrificial transistor gate structures. In addition, the plurality of sacrificial transistor gate structures are selectively removed to form a plurality of gate electrode openings in the dielectric layer, and first and second work function metal layers are selectively formed in the plurality of gate electrode openings and on the high-k gate dielectric layer to define a plurality of functional NMOS and PMOS transistors and one or more operatively inert high-k metal gate transistors. This may be accomplished by selectively removing one or more sacrificial polysilicon layers, alone or in combination with removing high-k gate dielectric layer, to form the plurality of gate electrode openings in the dielectric layer. When the high-k gate dielectric layers are removed, they are subsequently re-formed in the plurality of gate electrode openings prior to selectively forming first and second work function metal layers in the plurality of gate electrode openings. After forming the gate electrode openings, the first and second work function metal layers may be selectively formed by depositing and patterning an NMOS gate metal work function layer (e.g., a layer of TiAlN) in one or more PMOS transistors gate electrode openings to define one or more operatively inert high-k metal gate PMOS transistors. In other example embodiments, the first and second work function metal layers may be selectively formed by depositing and patterning a PMOS gate metal work function layer (e.g., a layer of TiN) in one or more NMOS transistors gate electrode openings to define one or operatively inert more high-k metal gate NMOS transistors. Finally, the example fabrication sequence may include forming a metal layer over the first and second work function metal layers in the plurality of gate electrode openings, and polishing the metal layer down to at least the dielectric layer to define a plurality of high-k metal gate electrodes for the functional NMOS and PMOS transistors and one or more operatively inert high-k metal gate transistors. By virtue of including the security circuit in the integrated circuit device, any attempt to reverse engineer the security circuit to identify the security circuit results in an extracted security circuit which provides the second different electrical function to disrupt a counterfeited integrated circuit device that is manufactured with the extracted security circuit.

In another form, there is provided an electric device and method for manufacturing and operation same. As disclosed, the electric device includes first and second standard cells, where a layout of transistors of the first standard cell is identical to a layout of transistors of the second standard cell. The first standard cell implements a first circuit function with one or more first high-k metal gate transistors of a first polarity type having a gate electrode work function metal layer of a first polarity type. The second standard cell implements a second circuit function that is different from the first circuit function with one or more second high-k metal gate transistors of the first polarity type having a gate electrode work function metal layer of a second, opposite polarity type, thereby defining one or more operatively inert high-k metal gate transistors in the second standard cell. In selected embodiments, the first standard cell implements a first pull down circuit function for a first pull down node by connecting the one or more first high-k metal gate transistors of the first polarity type between the first pull down node and a pull down reference voltage, and the second standard cell implements a second slower pull down circuit function for a second pull down node by connecting the one or more operatively inert high-k metal gate transistors between the second pull down node and a pull down reference voltage. In other embodiments, the first standard cell implements a multi-input latch circuit function for receiving first and second input signals by connecting the first and second input signals to first and second inverter circuits formed with the one or more first high-k metal gate transistors of the first polarity type, and the second standard cell implements a single input latch circuit function for receiving third and fourth input signals by connecting the third input signal to a third inverter circuit formed with the one or more operatively inert high-k metal gate transistors. In yet other embodiments, the first standard cell implements a first reset latch circuit function by connecting the one or more first high-k metal gate transistors of the first polarity type between an internal node and a pull up reference voltage, and the second standard cell implements a second latch circuit function without reset by connecting the one or more operatively inert high-k metal gate transistors between an internal node and a pull up reference voltage. In still yet other embodiments, the first standard cell implements a first timing delay circuit function by connecting the one or more first high-k metal gate transistors of the first polarity type connected as capacitors between an internal node and a reference voltage, and the second standard cell implements a second faster timing delay circuit function by connecting the one or more operatively inert high-k metal gate transistors connected as capacitors between an internal node and a reference voltage. In other embodiments, the first standard cell implements a NAND function by connecting the one or more first high-k metal gate transistors of the first polarity type between first and second standard cell inputs of the first standard cell and a first standard cell output; and the second standard cell implements an inverter circuit function by connecting a first input of the second standard cell to one or more operatively functional high-k metal gate transistors, and by connecting a second input of the second standard cell to one or more operatively inert high-k metal gate transistors.

In another form, there is provided an integrated circuit and method for manufacturing and operation same. As disclosed, the integrated circuit includes a plurality of transistors connected to form a predetermined circuit and a die copy protection circuit, where the plurality of transistors includes a plurality of inert high-k metal gate transistors of a first polarity type, each comprising a gate electrode work function metal layer of a second polarity type formed over a high-k gate dielectric layer to define an operatively inert high-k metal gate transistor in the die copy protection circuit. In selected embodiments, the plurality of inert high-k metal gate transistors of the first polarity type are limited to a predetermined maximum percentage of between 1 and 10 percent of the plurality of transistors. In embodiments where the plurality of inert high-k metal gate transistors are implemented as high-k metal gate PMOS transistors, each PMOS transistors may include a gate electrode work function metal layer formed with at least one of the group consisting of titanium (Ti), tantalum (Ta), molybdenum (Mo), tungsten (W), niobium (Nb), vanadium (V), tantalum nitride (TaN), and tantalum silicon nitride (TaSiN), tantalum carbide (TaC), titanium aluminum nitride (TiAlN), or tantalum magnesium carbide (TaMgC). In embodiments where the plurality of inert high-k metal gate transistors are implemented as high-k metal gate NMOS transistors, each NMOS transistors may include a gate electrode work function metal layer formed with at least one of the group consisting of titanium nitride (TiN), rhenium (Re), iridium (Ir), platinum (Pt), and ruthenium oxide ($RuO_2$), iridium oxide ($IrO_2$), molybdenum nitride (MoN), ruthenium (Rh), or indium oxide ($InO_2$). In other embodiments, the die copy protection circuit may include a security circuit for performing a first specified function which is formed with at least the plurality of inert high-k metal gate transistors and which has a circuit layout that is identical to a circuit layout of a standard cell in the integrated circuit for implementing a second specified circuit function that is different from the first specified circuit function.

Although the described exemplary embodiments disclosed herein are directed to various semiconductor device structures and methods for making same by switching or altering work function metal layers in an integrated high-k metal gate process, the present invention is not necessarily limited to the example embodiments which illustrate inventive aspects of the present invention that are applicable to a wide variety of fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the security features are described with example replacement gate and FinFET process details, this is merely for convenience of explanation and not intended to be limiting and persons of skill in the art will understand that the principles taught herein apply to other types of devices. Moreover, the thicknesses, materials, and doping types of the described layers may deviate from the disclosed examples. In addition, the terms of relative position used in the description and the claims, if any, are interchangeable under appropriate circumstances such that embodiments of the invention described herein are, for example, capable of operation in other orientations than those illustrated or otherwise described herein. The term "coupled," as used herein, is defined as directly or indirectly connected in an electrical or non-electrical manner. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A method for implementing hardware security in an integrated circuit device comprising:
    obtaining an integrated circuit device comprising a security circuit defining a first electrical function and formed with at least one or more operatively non-functional high-k metal gate transistors of a first polarity type having a work function metal layer suitable for a transistor of a second, opposite polarity type, where, if the one or more operatively non-functional high-k metal gate transistors were replaced with operatively functional high-k metal gate transistors of the first polarity type with a work function metal layer suitable for a transistor of the first polarity type, the security circuit would define a second electrical function that is different from the first electrical function.

2. The method of claim 1, where obtaining an integrated circuit device comprises:
    providing a wafer comprising a plurality of sacrificial transistor gate structures formed over the substrate;
    forming a dielectric layer having a substantially flat upper surface which exposes an upper surface of the plurality of sacrificial transistor gate structures;
    selectively removing the plurality of sacrificial transistor gate structures to form a plurality of gate electrode openings in the dielectric layer;
    selectively forming first and second work function metal layers in the plurality of gate electrode openings and on the high-k gate dielectric layer to define a plurality of functional NMOS and PMOS transistors and one or more operatively non-functional high-k metal gate transistors; and
    forming a metal layer over the first and second work function metal layers in the plurality of gate electrode openings; and
    polishing the metal layer down to at least the dielectric layer to define a plurality of high-k metal gate electrodes for the functional NMOS and PMOS transistors and one or more operatively non-functional high-k metal gate transistors.

3. The method of claim 2, where selectively forming first and second work function metal layers comprises forming an NMOS gate metal work function layer in one or more PMOS transistors gate electrode openings to define one or more operatively non-functional high-k metal gate PMOS transistors.

4. The method of claim 3, where forming the NMOS gate metal work function layer comprises depositing a layer of TiAlN in one or more PMOS transistors gate electrode openings to define one or more operatively non-functional high-k metal gate PMOS transistors.

5. The method of claim 2, where selectively forming first and second work function metal layers comprises forming a PMOS gate metal work function layer in one or more NMOS transistors gate electrode openings to define one or operatively non-functional more high-k metal gate NMOS transistors.

6. The method of claim 5, where forming the PMOS gate metal work function layer comprises depositing a layer of TiN in one or more NMOS transistors gate electrode openings to define one or more operatively non-functional high-k metal gate NMOS transistors.

7. The method of claim 1, where the security circuit comprises a pull down circuit for a first node connected to a pull down reference voltage by a plurality of pull down transistors comprising one or more first functionally operative high-k metal gate transistors connected between the first node and the pull down reference voltage, and one or more second operatively non-functional high-k metal gate transistors connecting the first node to the pull down reference voltage.

8. The method of claim 1, where the security circuit comprises a latch circuit for connecting one or more input ports to an internal node through a plurality of input circuits, where at least one of the plurality of input circuits comprises one or more operatively non-functional high-k metal gate transistors to prevent an input port from connecting to the internal node.

9. The method of claim 1, where the security circuit comprises a pull up circuit connecting an internal node to a pull up reference voltage for resetting a latch with one or more pull up transistors comprising one or more operatively non-functional high-k metal gate transistors connecting the internal node to the pull up reference voltage.

10. The method of claim 1, where the security circuit comprises a timing delay circuit connecting an internal node to a reference voltage with one or more operatively non-functional high-k metal gate transistors connected as capacitors between the internal node and the reference voltage.

11. The method of claim 1, further comprising reverse engineering the security circuit in the integrated circuit device to identify an extracted security circuit which provides the second electrical function that would disrupt a counterfeited integrated circuit device manufactured with the extracted security circuit.

12. The method of claim 2, where selectively removing the plurality of sacrificial transistor gate structures comprises removing a high-k gate dielectric layer to form the plurality of gate electrode openings in the dielectric layer.

13. The method of claim 12, further comprising firming a high-k gate dielectric layer in the plurality of gate electrode openings prior to selectively forming first and second work function metal layers in the plurality of gate electrode openings.

14. The method of claim 2, where selectively removing the plurality of sacrificial transistor gate structures comprises removing one or more sacrificial polysilicon layers to form the plurality of gate electrode openings in the dielectric layer which expose a high-k gate dielectric layer.

\* \* \* \* \*

UNITED STATES PATENT AND TRADEMARK OFFICE
CERTIFICATE OF CORRECTION

PATENT NO. : 8,980,734 B2
APPLICATION NO. : 13/790627
DATED : March 17, 2015
INVENTOR(S) : Tab A. Stephens et al.

It is certified that error appears in the above-identified patent and that said Letters Patent is hereby corrected as shown below:

In the Claims

Claim 13, Column 26, line 13, should read "13. The method of claim 12, further comprising forming a"

Signed and Sealed this
Thirtieth Day of June, 2015

Michelle K. Lee
*Director of the United States Patent and Trademark Office*